US012562205B2

(12) United States Patent
Lancaster et al.

(10) Patent No.: US 12,562,205 B2
(45) Date of Patent: Feb. 24, 2026

(54) POLARIZABLE DEVICE WITH CURRENT COMPLIANCE FOR POLARIZATION CONTROL

(71) Applicant: NaMLab gGmbH, Dresden (DE)

(72) Inventors: Suzanne Lancaster, Dresden (DE); Stefan Slesazeck, Arnsdorf (DE); Erika Covi, Groningen (NL)

(73) Assignee: NaMLab gGmbH, Dresden (DE)

( * ) Notice: Subject to any disclaimer, the term of this patent is extended or adjusted under 35 U.S.C. 154(b) by 169 days.

(21) Appl. No.: 18/606,390

(22) Filed: Mar. 15, 2024

(65) Prior Publication Data

US 2025/0292819 A1 Sep. 18, 2025

(51) Int. Cl.
*G11C 11/22* (2006.01)
(52) U.S. Cl.
CPC ........ *G11C 11/2275* (2013.01); *G11C 11/221* (2013.01); *G11C 11/223* (2013.01); *G11C 11/2259* (2013.01); *G11C 11/2273* (2013.01)
(58) Field of Classification Search
CPC . G11C 11/2275; G11C 11/221; G11C 11/223; G11C 11/2259; G11C 11/2273
See application file for complete search history.

(56) References Cited

U.S. PATENT DOCUMENTS

| | | | |
|---|---|---|---|
| 10,153,021 B1 * | 12/2018 | Di Vincenzo | ....... G11C 11/2273 |
| 2023/0215481 A1 * | 7/2023 | Ocker | ................... G11C 11/223 |
| | | | 365/203 |

OTHER PUBLICATIONS

"Ferroelectric Tunneling Junctions for Edge Computing", Erika Covi, et al., IEEE 2021.
"A Ferroelectric Tunnel Junction-based Integrate-and-Fire Neuron", P. Gibertini, et al., IEEE 2022.
"Improvement of FTJ on-current by Work Function Engineering for Massive Parallel Neuromorphic Computing", Suzanne Lancaster, et al., IEEE 2022.

* cited by examiner

*Primary Examiner* — Han Yang

(74) *Attorney, Agent, or Firm* — Dicke, Billig & Czaja, PLLC

(57) ABSTRACT

One aspect provides an electronic device including a polarizable device having a polarizable material layer disposed between a first and a second electrode with a polarized material portion having a polarization changeable to a number of discrete polarization states by application of switching charges, wherein an electrical response of the polarizable material layer changes with the polarization state. A current compliance device disposed between the second electrode and a first terminal forms a current path with the polarizable material layer. In response to a plurality of voltage pulses applied across the first electrode and first terminal, each to cause a switching current in the current path to apply a switching charge to the polarizable material layer to change the polarization state by a polarization amount, the current compliance device to maintain the switching current at a substantially constant magnitude for each voltage pulse independent of the polarization state.

22 Claims, 17 Drawing Sheets

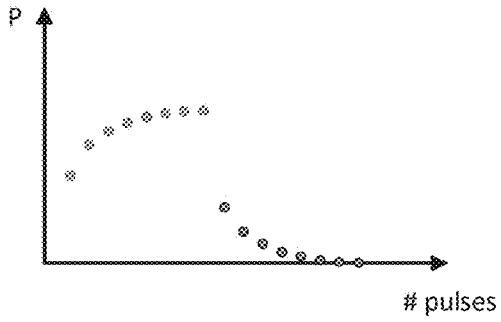
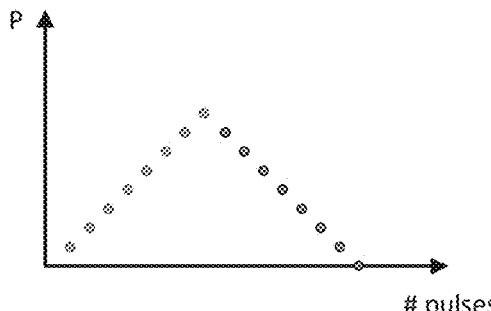
Fig. 1a (State of the art)                    Fig. 1b (State of the art)

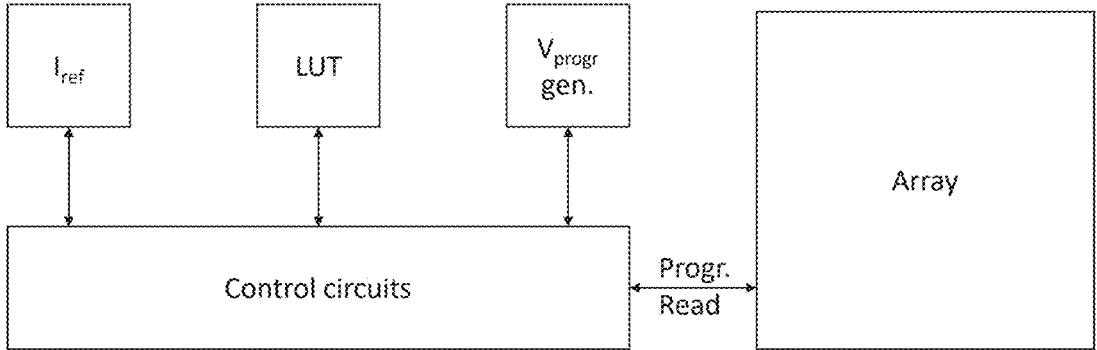
Fig. 2 (State of the art)

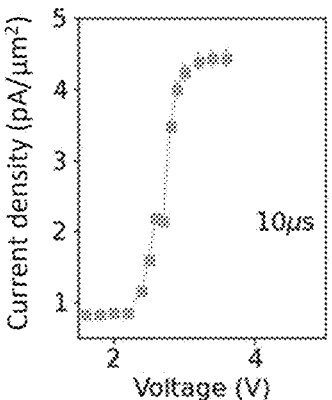
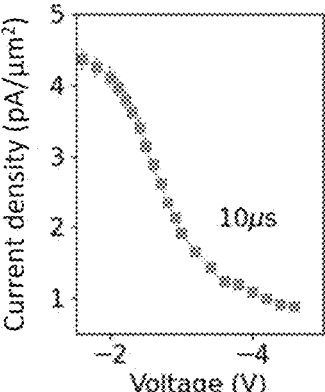
Fig. 3a (state of the art)
Fig. 3b (state of the art)

Fig. 8a                                        Fig. 8b

POLARIZABLE DEVICE WITH CURRENT COMPLIANCE FOR POLARIZATION CONTROL

BACKGROUND

The present disclosure is related to polarizable material stacks, polarizable memory cells, polarizable logic cells, polarizable logic in memory cells, and polarizable weighting cells for applications including multilevel memories and neuromorphic computation.

Many electronic devices and systems have the capability to store and retrieve information in a memory structure. The typical architecture used in modern electronics is von Neumann, where information is processed in a central processing unit (CPU) and stored in a physically separate memory. As a result, information must be repeatedly transmitted between the CPU and the memory, thereby creating what is referred to as the von Neumann bottleneck. "Logic in Memory" (LiM) and neuromorphic circuits reduce information transfer time and address the von Neumann bottleneck by using non-volatile memory (NVM) elements for combined information processing and logic implementation. A number of different non-volatile memory devices have been demonstrated, including Flash, resistive RAM (ReRAM), magnetoresistive RAM (MRAM), ferroelectric (FE), and phase change memory (PCM) memories.

Many non-volatile memory (NVM) elements can be realized using ferroelectrics, such as two-terminal devices (e.g., ferroelectric capacitors used in ferroelectric random-access memory (FeRAM) or ferroelectric tunnel junctions (FTJs)), and three-terminal devices (e.g. ferroelectric field effect transistors (FeFETs)). In FE memories, information is stored as a certain polarization state of a ferroelectric material layer within the structure. The ferroelectric material used are PZT, SBT, AlScN, hafnium dioxide ($HfO_2$), pure or doped with an additional element such as zirconium, silicon, lanthanum, gadolinium, yttrium, aluminum, or others. Furthermore, the material may display ferroelectric or antiferroelectric properties depending on the dopant and density.

Generally, hafnium/zirconium oxide-based memory devices offer fast sensing and programming access times and low power consumption during programming operation. Further, these memory devices are easy to integrate into High-k metal gate CMOS technology and can easily be integrated with CMOS circuitry since the materials employed for FeFET, FeRAM and FTJ memory devices are already used as gate oxide or DRAM dielectric materials. These advantages, and others, contribute to the increasing popularity of hafnium/zirconium oxide-based memory devices for applications requiring the simultaneous processing and storage of data such as smart devices, for multilevel memories and in beyond-von Neumann computing paradigms such as neuromorphic computing.

The ferroelectric material is intended to partially or fully replace a gate oxide of a transistor or a dielectric of a capacitor. The film is switched by applying an electrical field via a voltage across the ferroelectric film, herein referred to as a switching pulse. For multi-level switching, the voltage or pulse time can be chosen such that only a portion of the ferroelectric film and therefore a portion of the ferroelectric domains are switched. The changed polarization state alters the behavior of the ferroelectric device upon readout, depending on the device configuration and geometry.

From a circuit design perspective, the ideal programming scheme would be with identical voltage pulses, in order to minimize the circuit overhead needed to generate the programming pulses. However, when a memory device is stimulated with a train of identical voltage pulses, it typically shows a non-linear behavior of the polarization, as shown in FIG. 1 (*a*).

Currently, multilevel switching in ferroelectric devices is limited in its capability to produce multiple discrete polarization states of fixed and equal spacing. This is due to the nonlinearity of polarization switching, which means that the specific voltage pulse parameters needed to switch into a new polarization state depend on the number of domains already switched and thus on the polarization state which the device is currently in. As such, repeated voltage pulses will become less efficient in terms of additional polarization switching unless either the voltage pulse amplitude is increased or the voltage pulse frequency is decreased. The nonlinearity is strongest near the saturation of the orientation of the domains, where few domains are already switched, as the relative difficulty of switching additional domains depends on the fraction of domains already switched.

For practical applications of devices, the outcome is that the specific voltage pulse needed to switch from one memory level to a neighboring level is dependent on the actual state of the device. This means that an additional read-out operation is required before changing polarization state.

To achieve liner multilevel programming, voltage pulses with different amplitude are usually needed, as shown exemplarily in FIG. 1 (*b*) with linear increasing or decreasing of the voltage pulse amplitude. As an example, the hardware implementation of such a target programming algorithm follows the flow chart in FIG. 2 as a Scanning Control Unit (SCU) or Scanning Control Device (SCD). A Control Circuit is used to control the memory cell array access. For example, in a first step, the actual state of a memory cell is read (Read) by determining the actual read current. This current is then compared to a reference current Iref. The result might be used to determine suitable programming conditions from a look-up-table (LUT) which is then fed into a program voltage generator Vprogr gen. that generates a suitable programming voltage pulse that is then used again to update (Progr.) the state of the memory device within the array.

That is, once the actual state of the device has been determined, in the case of multilevel programming with nonidentical voltage pulses, the pulse parameters of the required switching pulse for updating the state must be determined. This may require the use of an additional capacitor, analog-to-digital converter or look-up table. Finally, the achievement of the correct state has to be verified and, if it is not achieved, the programming step has to be repeated.

The additional readout and iterative programming sequence required when performing target multilevel programming with non-identical pulses leads to an undesirable increase in programming times and power consumption. Further, in the case of FeRAM, where the readout is destructive, it precludes the possibility of multilevel switching.

Large asymmetries are inherent to devices, through processing (in the case of nominally symmetric devices) or stack design (in the case of devices with additional dielectric interlayers such as FTJs). Switching in 'positive' and 'negative' directions will then additionally require different absolute voltage pulse parameters.

FIG. 3 shows measured experimental data of the weight update in an FTJ when non-identical pulses with increasing voltages are applied (FIG. 3*a*), illustrating the asymmetry and nonlinearity in switching in positive and negative polarities (FIG. 3*b*).

Applying a current compliance is a method currently used to control the switching in PCM and ReRAM. In both cases, the function of the current compliance is different. In the case of PCM, a current compliance is used to control the heating of the active material and thereby the amount of active volume in which phase change occurs. For PCM, applying a current compliance may allow a stepwise update of the resistive state in the set direction. In the opposite direction, on the contrary, a stepwise update is precluded by the abruptness of the reset operation that is required to quench the amorphous state of the material.

In ReRAM, a current compliance is applied to limit the filament size and prevent device breakdown if the current passing through the device is too large. Since for ReRAM the aim of a current compliance is to protect the integrity of the active layer, the effects are not cumulative but rather ensure that the same switched state is reached upon each application of a switching pulse. In both cases, PCM and ReRAM, a fixed current compliance is not able to linearize the programming and especially not in a manner to support multilevel programming of a device.

Embodiments of the present disclosure demonstrate circuit designs which address the issue of non-linear multilevel programming of ferroelectric devices and methods of operation for these circuits to achieve a linear programming or linear multilevel programming.

SUMMARY

One aspect of the present disclosure provides an electronic device including a polarizable device having a first electrode, a second electrode, and a polarizable material layer disposed there between. The polarizable material layer includes a polarized material portion having a polarization changeable to a number of discrete polarization states by application of switching charges, wherein an electrical response of the polarizable material layer changes with the polarization state. A current compliance device is disposed between the second electrode and a first terminal and forms a charge current path with the polarizable material layer. In response to a plurality of voltage pulses applied across the first electrode and first terminal, each voltage pulse to cause a switching current in the charge current path to apply a switching charge to the polarizable material layer to change the polarization state by a polarization amount, the current compliance device is to maintain the switching current at a substantially constant magnitude for each voltage pulse independent of the polarization state. In examples, as presented herein, by providing control of the switching current, the current compliance device, in accordance with the present disclosure, provides methods for controlling and linearizing the multilevel programming of the polarizable material layer, also known as weight update, multilevel switching or gradual switching, by actively controlling the switched polarization charge during switching.

In examples, the present disclosure is related to polarizable material stacks, ferroelectric memory cells, ferroelectric logic cells, ferroelectric logic in memory cells, and ferroelectric weighting cells for applications including multilevel memories and neuromorphic computation. Presented herein is a method for controlling and linearizing the multilevel programming, also known as weight update, multilevel switching or gradual switching by actively controlling the switched polarization charge during switching. The embodiment described herein is an integrated circuit element, material property, and a method improving the programming and the read operation of an electronic element in particular by linearizing the switching of a device. The integrated circuit element and the method presented is used for, but not limited to, linearizing the polarization switching of any polarizable device, including but not limited to ferroelectric capacitors (FeCap), ferroelectric tunnel junctions (FTJ) and ferroelectric field-effect transistors (FeFET).

An embodiment described herein is an integrated circuit element, material property, and a method improving programming and the read operation of an electronic element in particular by linearizing the switching of a device. The integrated circuit element and the method presented is used for, but not limited to, linearizing the polarization switching of any polarizable device, including but not limited to ferroelectric capacitors (FeCap), ferroelectric tunnel junctions (FTJ), and ferroelectric field-effect transistors (FeFET). In this invention the current applied to the device during switching is controlled in order to regulate the change in the device polarization.

The change of the polarization state Pr of a polarizable device depends on material properties such as the coercive field, which vary from sample to sample and device to device. Furthermore, the voltage required to change the polarization state by an amount $\Delta P\_r$ varies nonlinearly with the current polarization state of the polarizable device.

In the case of a controlled current pulse with amplitude $I_{CC}$, the change in polarization $\Delta P$ will always be equal and limited by the switching charge which is allowed to flow to the electrodes of the device in a given time frame, given by:

$$\Delta P = I_{CC} \cdot \text{t\_pls}$$

where t_pls is the width of the applied controlled current pulse. Either $I_{CC}$ or t_pls can be varied to control the polarization change $\Delta P$. Meanwhile, the voltage drop across the polarizable material will vary depending on the actual state of the device, thereby balancing any variability in the coercive field of the ferroelectric layer.

Examples of different solutions for controlling the current applied for switching the polarizable material are included. Common to all these solutions is a current limiting or current compliance element. In one case, the current limiting element is connected in series to the polarizable device. A voltage pulse is applied to this series connection which is large enough to switch the polarization of the polarizable material to a target intent e.g., fully/completely. The current which can flow through the polarizable material, however, is controlled by the current limiting element, such that the voltage drops across the polarizable material results in a self-limited and partial switching of the polarization. This can be achieved for example via the series connection of a control transistor, where the gate voltage controls the maximum attainable source-drain current.

In this disclosure, a method to linearize the multilevel programming behavior of the polarizable devices is presented. In one example implementation of the proposed method a current pulse may be applied to the polarizable device, such that the actual amount of switched polarization $\Delta P$ will be defined by the current $I_{SWITCH}$ and the time $t_{SWITCH}$ that this current can flow according to $\Delta P = I_{SWITCH} \cdot t_{SWITCH}$. This can be realized by a pulsed current source defining $I_{SWITCH}$.

In a second example implementation of the proposed method a voltage pulse is applied to a polarizable device or polarizable memory cell where a current control $I_{CC}$ is incorporated directly into the polarizable device or polarizable memory cell, such that the switched polarization ΔP will be defined by the current control $I_{CC}$ and the time $t_{SWITCH}$ that this current can flow according to $\Delta P = I_{CC} * t_{SWITCH}$. Thereby the current control may be realized by the adoption of dissipative elements that are connected in series to the programming path of the ferroelectric device. Such dissipative elements can be for example, but not limited to resistors, diodes, Schottky diodes, and transistors.

For example, to enable linear programming of a polarizable device such as in one embodiment a polarizable capacitor, a current control is realized using a current limiting element connected in series, for example a resistor. In this case when applying constant voltage pulses to this series connection the change in the capacitor voltage is determined by the current flow through the current limiting element. This change in voltage further depends only on the capacitor's fixed charge-voltage relation as defined by its capacitance-voltage behavior. In this way, the change in the effective switching voltage that is experienced by the polarizable element becomes dependent on the actual polarization state of the device. In other words, the effective switching voltage is self-modulated in a way that it leads always to the same polarization change independently of the actual polarization state of the capacitor.

Example embodiments described herein finally lead to a linear polarization state update of the ferroelectric device with respect to the number or duration of applied pulses and with respect to the current control. This offers several advantages and solves several tasks in the field of polarizable device operation as explained in detail below.

First, a linear distribution of multilevel states (linear update of the polarization state) is achieved by using identical voltage pulses. The number of intermediate steps is easily and reproducibly controlled, by varying either the voltage pulse width or the maximum allowed current. The number of intermediate steps between fixed values of Pr will be device- and material-independent.

Second, it is not necessary to know the actual state of the device before performing the update. Therefore, no read operations are required, which are destructive for polarizable capacitors like ferroelectric capacitors (FeCap) devices and greatly reduce the update speed.

Third, the teachings of the present disclosure overcome the variability of programming conditions. Such variability typically originates from a variability in coercive field or saturation polarization as a consequence of the polycrystalline nature of the polarizable material, or due to the actual polarization state of the polarizable material itself. Following the method outlined here, the change in polarization will be independent of the material properties, depending only on the amount of charge accumulated, since the switching voltage is self-limiting. This means that no prior characterization of any individual device is necessary.

Overall, the teachings of the present disclosure reduce and overcome disadvantages of device-to-device and sample-to-sample variability. It also removes the need for additional characterization steps prior to device operation. Further, the amount of switched polarization will be independent of the aging of the device. Ferroelectric films typically undergo an aging process whereby the switchable polarization firstly increases (wakeup), then decreases (fatigue), and this can significantly modify the voltage required to switch the polarization. With the proposed embodiment, the amount of polarization switched in each step will remain constant regardless of material processing and aging.

This embodiment is of advantage for different types of application in microelectronics including, but not limited to, multilevel memory and neuromorphic computing, where a linear weight update is required. It further expands the possible applications of FeCap devices, where a destructive read operation is unavoidable. In addition, device operation is easily tailored to different applications, without sensitivity to material and device processing.

Particularly in the field of neuromorphic computing, facilitating a linear weight update (uniform change in the polarization state) without any prior knowledge of the system allows polarizable devices to operate at the speed required for real-time neuromorphic applications. The circumvention of device variability means that many devices can be operated simultaneously with high precision, enabling a high circuit density.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1a is the non-linear response of the polarization P of a polarizable memory stimulated by a number # of identical voltage pulses. The polarization increases non-linearly upon application of 8 identical positive pulses and afterwards decreases non-linearly with 8 negative pulses (state of the art).

FIG. 1b is the linear response of the polarization P of a polarizable memory stimulated after a number # of non-identical voltage pulses. The polarization increases linearly upon application of 8 positive pulses with increasing positive voltage amplitude depending on the device and materials properties and afterwards decreases linearly with 8 negative pulses with decreasing voltage amplitude depending of the device and materials properties (state of the art).

FIG. 2 is a flow chart of a Scanning Control Unit (SCU) or Scanning Control Device (SCD) to control the memory cell array access to determine the actual read current (state of the art).

FIG. 3a shows experimental data of the weight update of the current density in pA/μm2 of a ferroelectric tunnel junction (FTJ) when non-identical pulses with increasing positive voltages of 10 μs are applied, illustrating the asymmetry and nonlinearity in switching in the positive polarity (state of the art).

FIG. 3b shows experimental data of the weight update of the current density in pA/$\mu m_2$ of a FTJ when non-identical pulses with increasing negative voltages of 10 μs are applied, illustrating the asymmetry and nonlinearity in switching in the negative polarity (state of the art).

DETAILED DESCRIPTION

Figure 4:
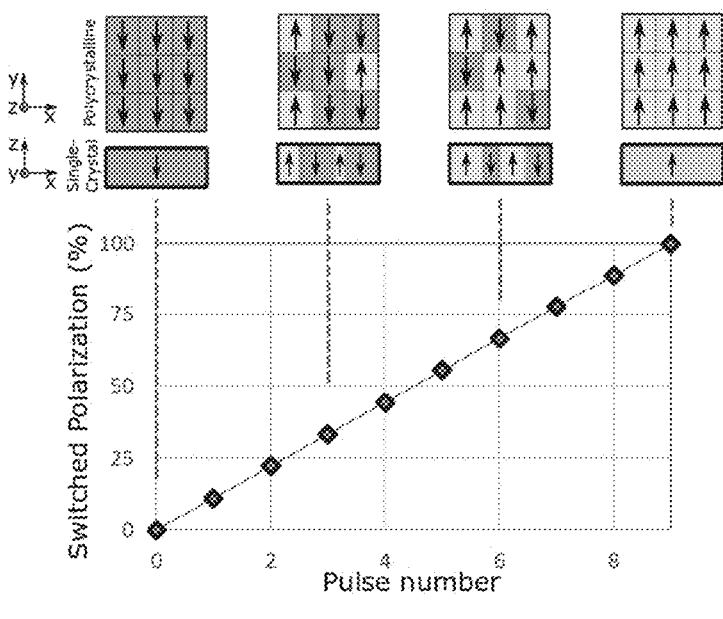
FIG. 4 illustrates the switching behavior of a polar device, either a polycrystalline material of 9 single-domain grains or a polydomain single-crystal material. The percentage of switched polarization is plotted as a function of pulse number, achieved as described in the invention by applying 10 identical positive voltage pulses with the same positive voltage amplitude, leading to 10 polarization states. The corresponding domain configurations of the polycrystalline and single-crystal material are illustrated for 4 pulse steps.

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise. It is further noted that the term "substantially", as used herein, is intended to serve as a modifier to imply that terms such as "identical", "same", and "equal", are to be interpreted as being "approximate" rather than "perfect".

The integrated circuit element and the method presented is used for, but not limited to, linearizing the polarization switching of any polarizable device, including but not limited to polarizable memory cells and transistors. The polarizable device makes use of a polarizable material, including but not limited to a ferroelectric material, an anti-ferroelectric material, or a relaxor type ferroelectric material. The polarizable device includes a capacitor, a tunnel junction, or a transistor, including but not limited to a ferroelectric capacitor (FcCap), a ferroelectric tunnel junction (FTJ), and a ferroelectric field-effect transistor (FcFET).

As described herein, one embodiment of a polarizable memory device includes a polarizable material stack that forms a polarizable capacitor having electrodes made from a metal or metallic compound, like TiN, Ti, Pt, TaN, W, or others, or a semiconductor material, like Si, Ge, GaN, GaAs, or others, or conductive oxides, such as $WO_2$, ITO, or others, and a polarizable material layer, like SBT, PZT, HfO2, $Hf_2Zr_2O_4$, or others, and may include additional non-polarizable dielectric layers depending on the device configuration and read-out mechanism. In accordance with the present disclosure, the polarizable material layer is a ferroelectric material, an antiferroelectric material or a relaxor type ferroelectric material.

The materials covered by this disclosure are either single-crystal, also known as epitaxial, or polycrystalline. In the case of single-crystal materials, domains are nucleated which then grow via domain wall motion. In this way, multilevel behavior is also achieved in single-crystal materials, and the number of possible states depends on the domain size, which is a material property. By this a high amount of polarization levels are achieved in one domain. The ferroelectric state can be considered as the ratio of material in each polarization state.

A second embodiment is a single-crystal material which is prepared such that two domains or more are nucleated (i.e. a polydomain configuration). Depending on the direction and size of the applied external field one domain grows by domain wall movement against a second domain. Through this a high amount of domain levels can be achieved. A reasonable number of domains, levels or domain levels/$\mu m^2$ for multilevel switching is 4.000. Linearizing the multilevel switching and switching one domain per time, this gives an overall number of 4.000 levels which corresponds to 12 bits or higher.

In polycrystalline materials as another embodiment, it can be considered that one or many domains may be switched per grain. If each grain supports multiple independent domains, this leads to the possibility of achieving a larger number of intermediate states. The number of switchable domains will determine the number of possible states via the relation ntot=n+1, where ntot is the number of possible states, and n is the number of domains.

Grain sizes in polycrystalline polarizable Hafnium dioxide (HfO$_2$) or Hafnium/Zirconium oxide (HZO) like Hf$_2$Zr$_2$O$_4$, are around 15 nm. In the case of one domain per grain, this gives a domain density of around 4,000 domains/$\mu m^2$ or 4,000 levels/$\mu m^2$. Linearizing the multilevel switching and switching one domain per time, this gives an overall number of 4,000 levels per $\mu m^2$ which corresponds to an overall bit density of 12 bits/$\mu m^2$ or more.

In other embodiments of polycrystalline materials one crystal contains more than one domain. In such materials switching occurs either by switching of single domains or by domain wall movement or by a combination of both. Such materials have the possibility of achieving a high amount of polarization states. By this a high number of bits can be stored or a high degree of linearization. Grain sizes in polycrystalline polarizable Hafnium dioxide (HfO$_2$) or Hafnium/Zirconium oxide (HZO) like Hf$_2$Zr$_2$O$_4$, are around 15 nm. In the case of two domains per grain, this gives a domain density of around 8,000 domains/$\mu m^2$. Linearizing the multilevel switching and switching one domain per time, this gives an overall number of 8000 levels per $\mu m^2$ which corresponds to 13 bits or more in homogeneous films.

In this disclosure, a method to linearize the multilevel programming behavior of the polarizable devices is described. In one implementation of the proposed method a current pulse is applied to the ferroelectric device, such that the actual amount of switched polarization $\Delta P$ will be defined by the current I$_{SWITCH}$ and the time t$_{SWITCH}$ that this current can flow according to $\Delta P=I_{SWITCH}*t_{SWITCH}$. This is realized by a pulsed current source defining ISWITCH. In a second implementation of the proposed method, a voltage pulse is applied to a ferroelectric device or ferroelectric memory cell where a current control is incorporated directly into the ferroelectric device or ferroelectric memory cell, such that the switched polarization $\Delta P$ will be defined by the current control value ICC and the time t$_{SWITCH}$ that this current can flow according to $\Delta P=I_{CC}*t_{SWITCH}$. Thereby the current control is in one embodiment realized as a current compliance through the adoption of electrically dissipative elements that are connected in series to the programming path of the ferroelectric device.

Figure 10:
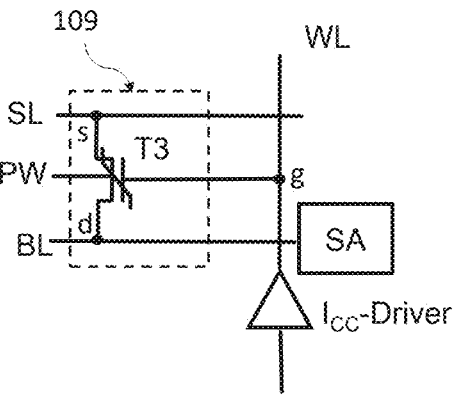
FIG. 10 illustrates one embodiment of this invention making use of a FeFET. The gate (g) of FeFET T3 is connected to a word line WL, whereas source terminal(s) and drain terminal (d) are connected to bit line BL and source line SL, respectively. The sense amplifier SA is connected to the bit line BL. The current driver "ICC-driver" connected to the word line WL is used to realize the current control by applying a suitable current pulse ICC to the WL while performing the programming operation of the FeFET T3.

In some examples, as described herein, such electrically dissipative elements, also referred to as current compliance devices, are implemented as an NMOS or PMOS transistors (e.g., see at least FIGS. 5a-5d), a resistor (e.g., see at least FIGS. 6a-6b), and a current source (e.g., see at least FIG. 10). It is noted that other suitable elements or devices may be employed as a current compliance device in accordance with the present disclosure. In example, the current compliance devices maintain the switching current at a substantially constant magnitude for each voltage pulse. In further examples, the current compliant device maintains the switching current magnitude within 5% of a selected magnitude. In other examples it is of advantage to maintain that switching current magnitude within 1% of a selected magnitude or at an even lower percentage.

The read-out operation to determine the stored polarization state of the ferroelectric device depends on the device concept.

When a current control is applied to a device during switching, the starting point of the effective switching voltage is determined by the actual polarization state of the device and the change in the effective switching voltage is limited by the amount of charge that can be delivered to the devices, i.e. the voltage drop is self-modulated.

In the ideal case for a polycrystalline material, where the number of grains is large enough and where the coercive voltages of individual domains follow a certain distribution, this self-modulation will lead to a linear polarization update where the same amount of polarization can be switched on each identical pulse. That is, the polarization update is linear with respect to the number or duration of the applied pulses and to the current control. This is illustrated in FIG. 4 for a polycrystalline material with 9 grains, leading to 10 polarization states. In other embodiments the same amount of polarization is defined with a tolerance of 5%, or 20% depending on the degree of linearization needed or accepted for a specific application.

The same behavior is achieved in a single-crystal or epitaxial material, as the domain nucleation and growth will be limited by the self-modulated voltage drop over the device. The number of intermediate polarization states will be determined by the pulse parameters, with the absolute limit determined by the material-dependent minimum domain size. This is also illustrated for 10 states in FIG. 10. In one example, the number of polarization states is at least 8. In other examples, any suitable number of polarization states may be employed.

In the non-ideal case where domains have very different coercive voltages, single-crystal films contain defects, or in the case of only a small number of switchable domains, deviations from the linear behavior might be observed. The accuracy of the linearization thus depends on the fabrication of the polarizable material, where it is an advantage to have a high number of domains, levels or domain levels in the polarizable material.

Figure 5A:
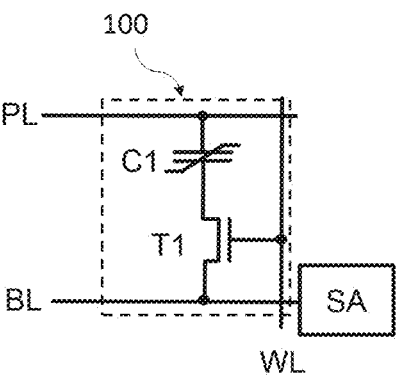
FIG. 5a illustrates a 1T1C FeRAM cell 100 featuring a selector transistor T1 connected between the bit-line BL and the ferroelectric capacitor C1, ferroelectric capacitor C1 features between the plate line PL and the select transistor T1. The word line WL is connected to the gate of the transistor T1 and a sense amplifier SA connected to the bit line BL.

One example embodiment of a polarizable device is a ferroelectric capacitor (FeCAP), such as the FeCAP illustrated and described by the example implementation of a 1T1C FeRAM cell 100 as depicted in FIG. 5a. In the example of FIG. 5a, the FeCAP, C1, includes a polarizable material layer disposed between first and second electrodes, with the first electrode connected to a plate-line (PL) and a second electrode. The 1T1C FeRAM cell 100 furthermore features a selector Transistor T1 that is connected between the bit-line BL and the second electrode of ferroelectric capacitor C1. For a read operation, a switching voltage pulse is applied to the plate-line PL. The switching charge from ferroelectric capacitor C1 is transferred to the bit-line BL and measured upon readout using a sense amplifier SA. Thereby the switched polarization depends on the currently stored polarization state of the FeCAP device and the read signal is proportional to the switched polarization.

To fully switch the polarization of C1 into the programmed state the following biases are used: VWL=VDD, VBL=0V and VPL=VDD. To fully switch the polarization of C1 into the erased state the following biases are used: VWL=VDD, VBL=VDD and VPL=0V. Thereby typical values of VDD are 2Vc with Vc being the coercive voltage of the ferroelectric film of the ferroelectric capacitor. A typical value of VDD can be for example 1,8V. In this way the access transistor T1 is fully switched on during the programming and erase operation.

In this embodiment, the access transistor T1 is used to realize the current control $I_{CC}$ by applying a suitable voltage to the WL that determines the maximum attainable source-drain current while performing the programming operation of the ferroelectric device C1 in FIG. 5a. In one example a suitable voltage pulse that is nominally large enough to fully switch the polarization state of the ferroelectric layer is applied via PL to the ferroelectric memory cell. A pulse of 3 V for 10 μs would be suitable to fully switch a FeCAP device. The current flow between PL and BL is limited by T1 to $I_{CC}$. This causes an increase of the drain voltage of T1 as soon as the switching current of the ferroelectric device would exceed $I_{CC}$, thus causing a self-control of the effective switching voltage applied to C1, respectively.

In order to realize a linear polarization state update, the following exemplarily biases are used: VBL=0 V, VPL=VDD and VWL=VCC, where VCC is a suitable current control voltage.

In the case of T1 being a NMOS transistor, a suitable voltage VCC that is in the range or below the threshold voltage of the select transistor T1 can be applied. The exact value of VCC depends on the threshold voltage of T1, its geometry, and other technological parameters. In one embodiment, a typical value of 0.5 V is applied to operate T1 in its subthreshold regime so that the source-drain current of T1 is limited to 1 nA. Further applying a typical switching pulse VDD=2 V to PL for 10 ns, assuming a coercive voltage of 1V for C1, results in a switching charge of 10 ns*1 nA=10 fC that can be delivered via T1 to C1 during the switching pulse time. Further assuming for C1 a maximum switchable polarization of 200 fC resulting from a typical capacitor of 1 μm² area and a switchable polarization Pr of 20 μC/cm² of the ferroelectric material, an amount of 10 fC/200 fC*100%=5% of the overall switchable polarization will be programmed during this one programming operation. In this way, a maximum of 20 successive similar switching pulses can be applied to PL in order to stepwise program C1 for full polarization reversal when starting from the fully erased state. Each switching pulse will result in a linear polarization update of 5% of the available polarization in the ideal case.

In another embodiment, VCC is set to 0.4 V, e.g. in a way that the drain-source current of T1 is limited to 0.5 nA. Applying the same pulse conditions as described above to PL would result in a switching charge of 10 ns*0.5 nA=5 fC that can be delivered via T1 to C1 during the switching pulse time. In this way only 2.5% of the switchable polarization might be programmed per pulse, leading to 41 programmable polarization states. This embodiment demonstrates that changing either the pulse duration or the current limit allows a great flexibility to electrically adjust the polarization update dynamics and number of intermediate polarization states.

Figure 5B:
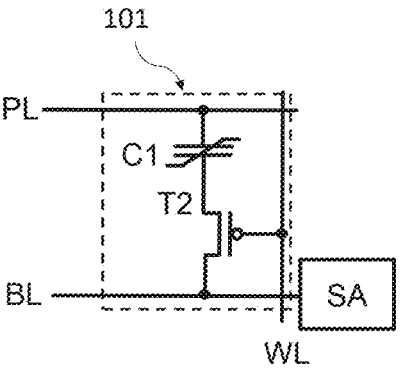
FIG. 5b illustrates a 1T1C FeRAM cell 101 featuring a selector transistor T2 realized as a PMOS that is connected between the bit-line BL and the ferroelectric capacitor C1, ferroelectric capacitor C1 features between the plate line PL and the select transistor T2. The word line WL is connected to the gate of the transistor T2 and a sense amplifier SA connected to the bit line BL.
Figure 5C:
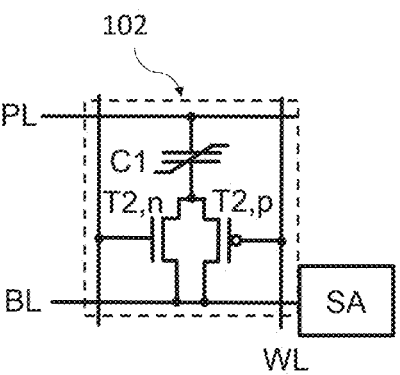
FIG. 5c illustrates a 2T1C FeRAM cell 102 featuring two selector transistor T2,n and T2,p in parallel realized as a NMOS and a PMOS transistor which are connected in parallel between the bit line BL and the ferroelectric capacitor C1, ferroelectric capacitor C1 features between the plate line PL and the two select transistor T2,n and T2,p. The word line WL is connected to the gate of the transistor T2,n and T2,p and a sense amplifier SA connected to the bit line BL.
Figure 5D:
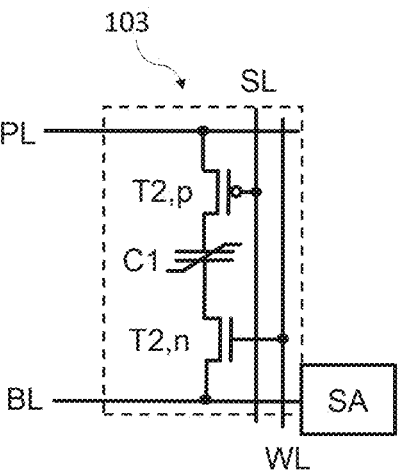
FIG. 5d illustrates a 2T1C FeRAM cell 103 featuring a selector transistor T2,n realized as a NMOS between the bit line BL and the ferroelectric capacitor C1 and a second selector transistor T2,p realized as a PMOS between the plate line PL the ferroelectric capacitor C1. Where the source line SL is connected to the gate of the PMOS T2,p and the word line WL is connected to the gate of the NMOS T2,n. The sense amplifier SA connected to the bit line BL.

In another example, cell 101 the select transistor might be realized in different variations, such as, but not limited to, the examples described here. For example, as shown in FIG. 5b, transistor T2 might be realized as a PMOS transistor, or as another embodiment cell 102 a parallel connection of a NMOS (T2,n) and a PMOS transistor (T2,p) as shown in FIG. 5c. Moreover, the select transistor might be connected between C1 and the PL, again being a NMOS, a PMOS or a parallel connected pair of NMOS and PMOS transistors. In a further embodiment cell 103 shows in order to allow controlled polarization update in either direction, a NMOS transistor T2,n might be connected between BL and C1 whereas a PMOS transistor T2,p might be connected additionally between C1 and PL as shown in FIG. 5d. By these embodiments it is demonstrated that the invention can be realized in different circuit configurations. In either case suitable voltages to control the switching current of C1 during program or erase operation have to be applied to the gate terminals of the transistors, whereby at least one of the transistors realizes the current control, whereas other transistors might just be switched on or off completely, depending on the specific write or program operation.

Figure 6A:
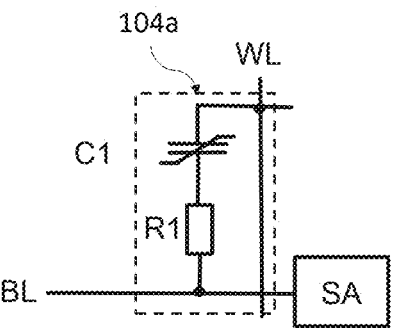
FIG. 6a illustrates an embodiment of a ferroelectric memory cell 104a where the the ferroelectric capacitor C1 is connected between the word line WL and a resistor R1. The resistor R1 is connected between the bit line BL and the ferroelectric capacitor C1. The sense amplifier SA is connected to the bit line BL.

In another embodiment of the invention of cell 104a the current control is realized by a dissipative element, such as a resistor R1 that is connected between a ferroelectric polarizable device C1 and the BL, as depicted in FIG. 6a. In this configuration the resistance of R1 is chosen in a way that the voltage drops over R1 will limit the charge that can be delivered to the ferroelectric capacitor C1 during the switching pulse applied to PL. For this detailed embodiment, the desired switching current of 1 nA for a switching pulse voltage of 5 V and a coercive voltage of C1 of 1 V, a suitable resistor of (5 V−1 V)/1 nA=4e9Ω is realized. Assuming a coercive voltage distribution of the different domains in the range of 0.5 V to 1.5 V, throughout the full dynamic range of the polarization switching the current will be limited to values in the range Imin=4e9Ω/(5 V−1.5 V)=0.875 nA to Imax=4e9Ω/(5 V−0.5 V)=1.125 nA. A further increase of the switching pulse amplitude together with an increase of the resistance obviously would further improve the current control.

Figure 6B:
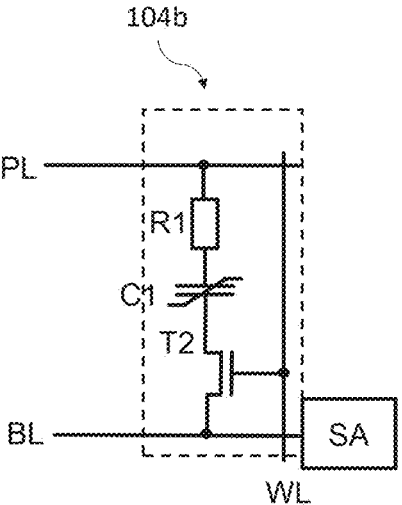
FIG. 6b illustrates an embodiment of a ferroelectric memory cell 104b where ferroelectric capacitor C1 is connected between transistor T2 and a resistor R1. The resistor R1 is connected between the bit plate line PL, the ferroelectric capacitor C1, and the gate of the transistor T1 to the word line WL. The transistor T1 is connected between the bit line BL and the ferroelectric capacitor C. The sense amplifier SA is connected to the bit line BL.

In another embodiment of cell 104b a combination of transistor T2 and resistor R1 as in FIG. 6b is also possible with the same effect and voltage biasing scheme. In this case, bipolar voltages can be used too.

In other embodiments the dissipative element might be realized, but not limited to, as thin film resistor, a diode, a tunneling diode, a varactor, a resonant tunneling diode or other electrical component featuring at least two electrodes which is suitable to control the switching current. Such dissipative examples, also referred to herein as current compliance devices, are configured to maintain the switching current at a substantially constant magnitude for each voltage pulse independent of the polarization state. In one example, the switching current magnitude is maintained within 5% of a selected magnitude. Moreover, these elements might be realized as separate elements, or might be directly incorporated into the ferroelectric device, for example by layer engineering in multi-layer stacks consisting of ferroelectric layers, dielectric layers and semiconducting or metallic layers.

Another embodiment of this invention of a polarizable device is a ferroelectric tunneling junction FTJ. In this device the effective tunneling barrier and hence its resistance state is determined by the ferroelectric polarization of the ferroelectric layer sandwiched between the electrodes. In contrast to the ferroelectric capacitor, the polarization state of the FTJ is read non-destructively by applying a read voltage well below the coercive voltage Vc and sensing the resulting polarization dependent tunneling current which is proportional to the polarization state.

Figure 7:
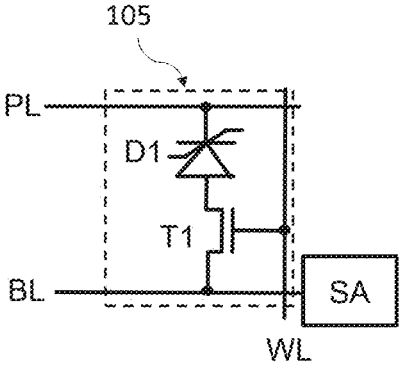
FIG. 7 illustrates a 1T1D memory cell 105 featuring a ferroelectric tunnel junction D1 between the plate line PL and a transistor T1 and a Transistor T1 between the bit line BL, the ferroelectric tunnel junction D1, and the gate connected to the word line WL. The sense amplifier SA is connected to the bit line BL.

In a more detailed embodiment, a 1T1D memory cell 105 for example is shown in FIG. 7. In order to program the FTJ D1, a similar approach as for the ferroelectric capacitor of embodiments described before is used. In one specific embodiment T1 being an NMOS transistor a suitable voltage VCC that is in the range or below the threshold voltage of the select transistor T1 is applied. The exact value of VCC depends on the threshold voltage of T1, its geometry and other technological parameters. In this embodiment, a typical value of 0.5 V is applied to operate T1 in its subthreshold regime so that the source-drain current of T1 would be limited to 1 nA. Applying further the switching pulse VDD=4V to PL for 10 ns assuming a coercive voltage of about 2V for D1 results in a switching charge of 10 ns*1 nA=10 fC that is be delivered via T1 to D1 during the switching pulse time. Assuming further in this example for D1 a maximum switchable polarization of 200 fC resulting from a typical capacitor of 1 $\mu m^2$ area and a switchable polarization Pr of 20 $\mu C/cm^2$ of the ferroelectric material, an amount of 10 fC/200 fC*100%=5% of the overall switchable polarization will be programmed during this one programming operation. In this way, a maximum of 20 successive similar switching pulses can be applied to PL in order to stepwise program D1 for full polarization reversal when starting from the fully erased state. Each switching pulse will result in a linear polarization update of 5% of the available polarization in the ideal case.

For typical DC read current densities of FTJ devices that are in the range of 10 $pA/\mu m^2$ and thus being well below the typical polarization switching currents, the additional charge flow through D1 will have a negligible impact on the linearization of the polarization update. Thus, a very similar linearized programming as in the case of the ferroelectric capacitor can be applied.

For performing the read operation of the FTJ, the following exemplarily biases are used: VBL=0 V, VPL=$V_{read}$ and VWL=VDD, where $V_{read}$ is a suitable read voltage smaller than the coercive voltage Vc to be applied to the FTJ. For example, for a Vc=2 V of the FTJ device, a $V_{read}$=1.3 V might be applied. Since VDD is applied to the gate of T1 to fully switch T1 on, the read voltage that is applied between bit-line (BL) and plate-line (PL) is effectively applied to the FTJs (D1) terminals. The resulting read current is sensed using a sense-amplifier SA that might be connected to the BL.

Figure 8:
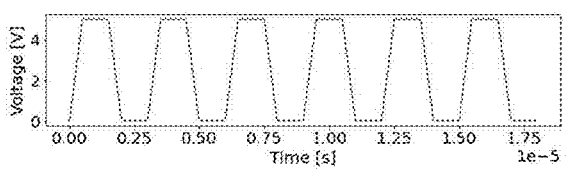
FIG. 8a is a graph of simulated 6 voltages pulses over the time applied to a polarizable device to demonstrate the effect of current compliance shown in FIG. 8b.
FIG. 8b is a graph of simulated polarization change over the number of applied voltage pulses as shown in FIG. 8a of polarizable device under current compliance as described by this invention.

How switching under current compliance enables linear programming is explored via simulations. Results are shown in FIG. 8. The same simulated pulses are applied (FIG. 8*a*), and the current is limited by the compliance (FIG. 8*b*). In this case, the voltage drop over the ferroelectric is self-modulated depending on the polarization state of the device. This leads to a linear weight update.

Due to the cell-internal automatic control of the effective switching voltage the programming pulse will lead to a well-defined partial switching of domains, i.e. multilevel programming, where the switched domains can have a certain distribution of coercive voltages. This means that sending a subsequent identical pulse (with current compliance) will still lead to a switching of additional domains.

In a specific embodiment the polarizable device is operated in binary mode by differentiating only between two polarization states ("1" or "0"). However, for embodiments with multibit storage the polarizable device may also be operated in a multi-level mode using three, four, five or more distinct polarization levels. In this case, a multi-level sense amplifier should be used to determine the stored polarization state. Moreover, for analog computing the polarizable device may be operated in an analog mode.

In embodiments with multi-level states, the polarization of the polarizable layer is only partially switched in order to achieve intermediate polarization states. The process by which the device is partially switched, referred to herein as multilevel programming, may additionally be referred to as multilevel switching, synaptic weight update, gradual switching, or in another way. The disclosure herein refers to any operation mode in which the polarization is partially switched in a polarizable device.

Figure 9:
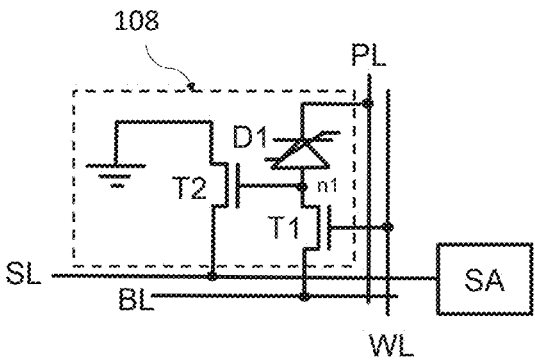
FIG. 9 illustrates one embodiment of this invention by a ferroelectric tunnel junction making use of a 2T1C cell 108. Transistor T1 is connected via node n1 to the gate of transistor T2 and the ferroelectric tunnel junction D1. The ferroelectric tunnel junction D1 is connected between the plate line PL and the node n1. Transistor T2 is connected between ground and source line SL and the gate is connected to node n1. Transistor T1 is connected between node n1 and bit line and the gate is connected to the word line. The sense amplifier SA is connected to the bit line BL.

In specific embodiments of the invention the read current of the FTJ could be very small with values down to the order of some pA. Overcoming low read current in another embodiment is described in the following by making use of a 2T1C cell 108 as depicted in FIG. 9. Here, a read transistor T2 is added. To read D1, node n1 is pre-charged through access transistors T1. In this embodiment, the access transistor T1 is used to realize the current control ICC by applying a suitable voltage to the WL while performing the programming operation of the ferroelectric device D1 in FIG. 9. In this example a voltage pulse being nominally large enough to fully switch the polarization state of the ferroelectric layer is applied via PL to the ferroelectric memory cell. The current between PL and BL is limited by T1 to the current compliance ICC by causing an increase of the drain voltage of T1 as soon as the switching current of the ferroelectric devices would exceed ICC, thus causing a self-control of the effective switching voltage applied to C1 or D1 respectively. T1 is then switched off and n1 is charged via D1. After a development time on the order of 100 μs, the current through T2 is read using a sense-amplifier SA that is connected to source-line SL. The current is proportional to the voltage at n1, which in turn is proportional to the polarization state of D1.

In an embodiment making use of a FeFET device, the polarization state alters the conduction of a channel for which the polarized layer stack acts as a gate. FIG. 10 is a schematic diagram of a ferroelectric memory cell 109 with a FeFET device T3, according to one example of the embodiments of the invention. In the illustrated example of FIG. 10, the gate (g) of FeFET T3 is connected to a word line WL, whereas source terminal(s) and drain terminal (d) are connected to bit line BL and source line SL, respectively. The body contact (b) of the transistor might be floating or might be connected to a p-well PW terminal which is shared by many memory transistors in a memory array (not illustrated). In this embodiment, the current driver "ICC-driver" is used to realize the current control by applying a suitable current pulse ICC to the WL while performing the programming operation of the FeFET device T3.

The stored polarization state of the ferroelectric layer is determined by sensing either the threshold voltage of the transistor, for example by applying a suitable read voltage to the word-line WL that is connected to the gate of FeFET T3 and sensing the source-drain current flowing from source-line SL to bit-line BL through the device using a sense amplifier SA. The polarization state of the FeFET is maintained during a read operation. Therefore, it is a non-destructive read operation.

Figure 11:
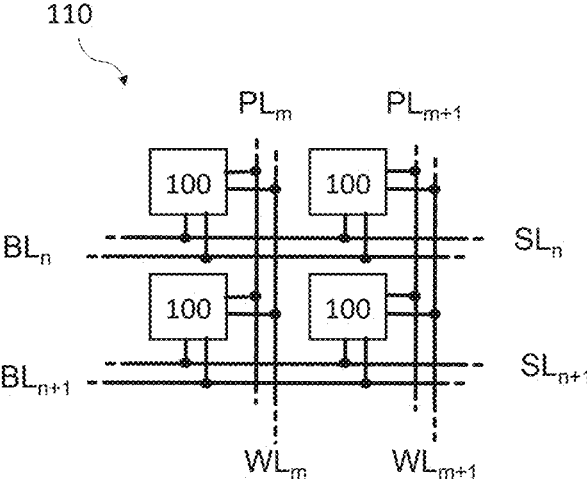
FIG. 11 illustrates one embodiment of this invention by an array of multiple cells 110 featuring different memory cells 100 sharing same WLs, PLs, BLs, PWs or SLs.

The different memory cells 100, 101, 102, 103, 104*a*, 104*b*, or 105 and similar ones might be arranged in arrays, thus multiple cells 110 sharing same WLs, PLs, BLs, PWs or SLs, as shown exemplarily in FIG. 11 for memory cell 100.

The sensing of the polarization state is typically performed by either charging the BL or SL and sensing the voltage change at the bit line after a certain time by comparing it to a reference voltage using a voltage sense-amplifier, or by directly sensing the current flow through the FE device by adoption of a suitable current sense amplifier.

In another embodiment the invention is used to limit the switched charge during readout of a ferroelectric capacitor. For example, as described above, the polarization switching of C1 in FIG. 5*a* is limited to 5% during read operation when applying a suitable VCC to T1 instead of switching T1 on completely. In this way, the capacitor C1 is read out 20 times before the full polarization reversal is attained. In this way the invention allows to mitigate the effect of the destructive readout at the cost of lowering the attainable voltage signal at the BL for one read pulse.

The different memory cells 100, 101, 102, 103, 104*a*, 104*b* or 105 and similar ones might be connected directly to other analog or digital circuits to form synaptic weighting cells, neuron cells or compute-in-memory where the sensing operation is combined with a logic operation, such as a vector-matrix-multiplication or similar.

In another example a resistor is used to realize a current compliance as depicted in FIG. 6*a*. In this case, a ferroelectric capacitor C1 and a resistor R1 form a ferroelectric memory cell 104*a*. Multiple such memory cells might share the same word-lines WL and bit-lines BL to form a cross-bar array of ferroelectric memory cells. During a write or program operation, the polarization switching current causes a voltage drop according to Ohm's law which can be used to limit the effective switching voltage applied to the ferroelectric device. It is to be understood, that all these embodiments of circuits will either be realized in planar circuits, for example on Silicon wafers, or with the same effect could be realized with vertical transistors, vertical memory cells, or other vertical devices. A combination of lateral and vertical devices is of obvious interest in possible applications.

Possible additional applications of the invention are in the field of in-memory and neuromorphic computing. In-memory computing requires linearly spaced states of the ferroelectric device to carry out multiply and accumulate (MAC) operations in one step. One embodiment of the invention described herein is used in circuits for in-memory computing. The invention described herein allows the ability to program multilevel, linearly spaced states in a polarizable device. In-memory computing can be performed with ferroelectric devices or other polarizable devices. The ability to program multilevel linearly spaced states is achieved by enabling linear programming with trains of identical voltage pulses.

Compared to digital solutions, the multilevel approach to computing has the feature of accelerating computation. Indeed, in digital computation the result of a MAC operation is given after several clock cycles. In-memory computing instead uses a crossbar configuration as shown in FIG. 11 and gives the result of an operation as $$I_{SL,i} = \sum_{0}^{j} G_{ij} \cdot V_{PL,j},$$

were $I_{SL,i}$ is the current read at the $i^{th}$ SL row, $G_{ij}$ is the conductance of the ferroelectric device at the $i^{th}$ row, $j^{th}$ column, and $V_{PL,j}$ is the voltage applied at the $j^{th}$ PL column in one single step. In this application, inference, i.e., reading the resulting current, is not the major challenge, rather the challenge lies in the ability to program multilevel linearly spaced states in the ferroelectric device. Indeed, state-of-the-art solutions usually adopt program & verify algorithms, where after each pulse, the state of the device is read and if it is not the target value, another programming step is executed, typically with an increased voltage amplitude. This procedure is iterated until the real value reaches the target value and it has a non-negligible cost in terms of execution time and area (extra circuits to carry out the algorithm). The invention solves this problem by enabling linear programming with trains of identical voltage pulses. Due to the invention, which keeps $I_{CC}$ constant by always using the same $V_{WL}$, there is no need to always read the device state, since it depends on the number of applied pulses. Moreover, the circuitry needed is significantly simplified, since there is no need to generate increasing voltage pulses. As an example, it is assumed that the device has 10 different linear states. The device is initialized in state 5. If state 8 has to be reached, 3 pulses must be applied to the PL. From there, if state 4 is to be reached, 4 pulses in the opposite polarity to PL have to be applied. In all these operations, there is no need to read the device state between the pulses.

In another embodiment the invention is used in neuromorphic applications by making use of linear programming when this is required by the learning rule, e.g., backpropagation or gradient descent-based rules.

Figure 12:
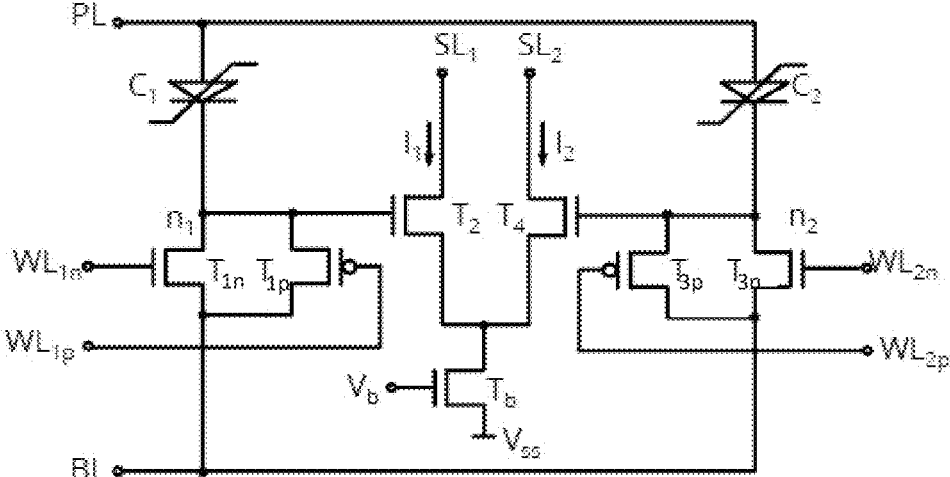
FIG. 12 illustrates one embodiment of the invention by a differential synapse making use of only seven transistors, which are of 7 different types T1n, T1p, T2, T3n, T3p, T4, and Tb.

One embodiment of the invention is a differential synapse as shown in FIG. 12. This embodiment makes use of only seven transistors, which are of 7 different types T1*n*, T1*p*, T2, T3*n*, T3*p*, T4 and Tb. C1 and C2 are programmed with complementary weights by applying proper voltages to the word line WL1*n*, WL1*p*, WL2*n*, and WL2*p*, to the bit line BL, plate line PL, bias voltage Vb and low power supply Vss.

The ferroelectric tunnel junction C1 is connected between PL and n1. Transistors T1*n* and T1*p* have the drain and source, respectively, connected to n1 and the source and drain, respectively, connected to BL. Their gates are connected to word lines WL1*n* and WL1*p*, respectively. The gate of T2 is connected to n1, the drain to source line SL1, and the source to the drain of Tb. Current I1 flows through T2. The ferroelectric tunnel junction C2 is connected between PL and node n2. Transistors T3*n* and T3*p* have the drain and source, respectively, connected to n2 and the source and drain, respectively, connected to BL. Their gates are connected to WL2*n* and WL2*p*, respectively. The gate of T4 is connected to n2, the drain to source line SL2, and the source to the drain of Tb. Current I2 flows through T4. Transistor Tb has the drain connected to the sources of T2 and T4, the drain connected to the lowest power supply VSS, and the gate to the bias voltage Vb. The two source lines SL1 and SL2 have to be connected by appropriate currents I1 and I2. The nodes n1 and n2 are connecting C1 and C2 to the different transistor nodes. Read operation is carried out as the 2T1C structure but the use of a differential pair whose maximum current is determined by Tb and Vb has the consequence that the current in one branch increases and the other decreases. This enables faster differential reading.

The operation is done as following in this embodiment: PL goes to 5 V to set the device (i.e., the weight has to go one step up) and it stays at 5 V for the duration of the spike, typically in the tens of us range, otherwise it is =V; BL is 0 V most of the time, unless in case of a reset operation (i.e., the weight has to go one step down), then it goes to 5 V for the duration of the reset pulse, typically in the tens of us range. The current compliance is applied by setting the voltage on WL1 and WL2 in the range from hundreds of mV to few volts. The duration of the pulse at WL1 and WL2 is in the same range of the pulse at PL and BL. In this configuration, complementary weights must be achieved.

Figure 13:
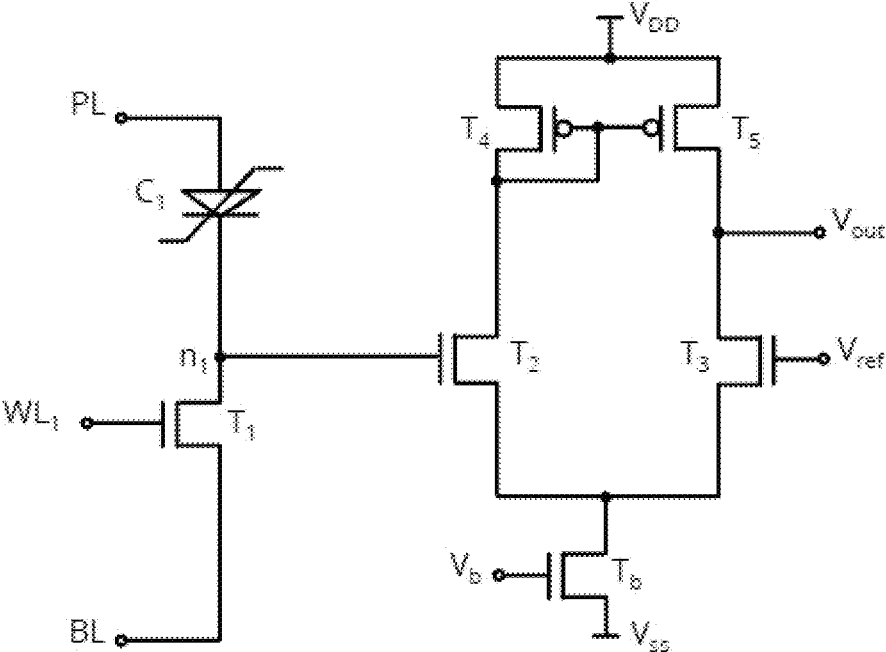
FIG. 13 illustrates one embodiment of the invention implemented as a ferroelectric neuron making use out of only six transistors, which are of 6 different types T1, T2, T3, T4, T5, and Tb.

Another embodiment of the invention is a ferroelectric neuron in FIG. 13. C1 is programmed by applying proper voltages to WL1, PL and BL. During the reading phase, when the voltage at n1 of transistor T1 rises higher than the reference voltage $V_{ref}$ applied to the gate of T3, the output voltage Vout goes from the low power supply $V_{ss}$ to the high power supply Vdd, thus generating a spike. The ferroelectric tunnel junction C1 is connected between PL and n1. Transistor T1 has the drain connected to n1 and the source connected to BL. The gate is connected to word line WL1. The gate of T2 is connected to n1, the source to Tb, and the drain to T4. The gate of T3 is connected to the reference voltage $V_{ref}$, the source to Tb, and the drain to T5 and to the output voltage $V_{out}$. Gate and drain of T4 are connected together and to T2 and T5, the source is connected to the highest power supply $V_{DD}$. The gate of T5 is connected to T4 and T2, the drain to T3 and $V_{out}$, the source to $V_{DD}$. Transistor Tb has the drain connected to the sources of T2 and T4, the drain connected to the lowest power supply VSS, and the gate to the bias voltage Vb. Transistors T2 to T5 and Tb constitute an example of simple single-stage operational amplifier with active load (T4 and T5) in open loop configuration, this working as a comparator. The output of the comparator is low ($V_{ss}$) when n1<$V_{ref}$ and it goes high ($V_{DD}$) when n1>$V_{ref}$. Vb is the voltage applied to the transistor Tb that determines the bias current flowing through the operational amplifier.

In this embodiment, the operation is performed as follows: $V_{SS}$=0 V, $V_{DD}$=5 V, PL is 0 V most of the time, unless a spike comes and it goes to 5 V for the duration of the spike, typically in the tens of us range, BL is 0 V most of the time, unless the device has to be reset, then it goes to 5 V for the duration of the reset pulse, typically in the tens of us range. The current compliance is applied by setting the voltage on WL1 and the range is from hundreds of mV to few volts. The duration of the pulse at WL1 is in the same range as the spike at PL.

According to such embodiment, the operation is done as follows: Initially, the device is in high resistive state. Each pulse at PL changes the device state. The value of WL determines how many linear programming steps are needed before all the domains are switched. After each pulse, a read phase that follows the 2T1C principle is carried out. A Spike is generated by the right side of the circuit during the read phase only when all the domains are switched.

It is to be understood that also in these kinds of circuits the current control to switch the ferroelectric devices might be realized, but not limited to, as another dissipative element such as a thin film resistor, a diode, a tunneling diode, a varactor, a resonant tunneling diode or other electrical components featuring at least two electrodes that are suitable to control the switching current. Moreover, it is to be understood, that the current control might be realized as a separate circuit block, for example by a current control driver circuit "$I_{CC}$-driver" similar as the one shown in FIG. 10, which however in this case is connected to the PL terminal of FIG. 13.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. An electronic device comprising:
a polarizable device including:
    a first electrode;
    a second electrode; and
    a polarizable material layer disposed between the first and second electrodes with a polarized material portion having a polarization changeable to a number of discrete polarization states by application of switching charges, wherein an electrical response of the polarizable material layer changes with the polarization state; and
a current compliance device disposed between the second electrode and a first terminal and forming a charge current path with the polarizable material layer, in response to a plurality of voltage pulses applied across the first electrode and first terminal, each voltage pulse to cause a switching current in the charge current path to apply a switching charge to the polarizable material layer to change the polarization state by a polarization amount, the current compliance device to maintain the switching current at a substantially constant magnitude for each voltage pulse independent of the polarization state.

2. The electronic device of claim 1, wherein the current compliance device maintains that switching current magnitude within 5% of a selected magnitude.

3. The electronic device of claim 1, when the plurality of voltage pulses comprises a plurality of substantially identical voltage pulses, a magnitude of the switching charge applied to the polarizable material layer is substantially the same for each voltage pulse so that each voltage pulse changes the polarization state by a polarization amount of a substantially same magnitude.

4. The electronic device of claim 3, wherein the number of possible polarization states depends on the magnitude of the switching charge.

5. The electronic device of claim 4, wherein the magnitude of the switching charge depends on a duration of each voltage pulse and/or a magnitude of the switching current.

6. The electronic device of claim 3, wherein the number of discrete polarization states extend over a range of polarization states from a polarized state where an entirety of the polarized material portion has a non-reversed polarization to a polarized state when the entirety of the polarized material portion has a reversed polarization, wherein each discrete polarization state is separated from adjacent polarization states by a substantially same polarization amount.

7. The electronic device of claim 6, wherein each polarization state corresponds to a different amount of the polarized material portion having the switched-on state.

8. The electronic device of claim 1, wherein a change in polarization comprises a change in size and orientation of one or more polarizable domains of the polarized material portion.

9. The electronic device of claim 1, wherein a change in polarization comprises a change in size and orientation of one or multiple polarizable grains of the polarized material portion.

10. The electronic device of claim 1, wherein the polarization state represents a stored logic value, with each polarization state representing a different logic value.

11. The electronic device of claim 1, wherein the current compliance device comprises a transistor having a source terminal, a drain terminal, and a gate terminal, wherein one of the source terminal and the drain terminal is coupled to the second electrode and the other of the source terminal and drain terminal is coupled to the first terminal such that the source-to-drain path forms part of the charge current path, and wherein the gate terminal is to receive a bias voltage to bias the transistor at or below a threshold voltage of the transistor to dictate the switching current magnitude.

12. A method of programming a polarization state of an electronic device including a polarizable material having an available polarization changeable to a number of discrete polarization states by switching portions of the available polarization between a reversed polarization and a non-reversed polarization, wherein each polarization state represents the available polarization having a different amount of reversed polarization, the method comprising:

applying a plurality of voltage pulses to the polarizable device, each voltage pulse to cause a switching current to flow in a switching current path through polarizable material for a duration of the pulse to deliver a switching charge to switch the polarization of a portion of the available polarization to change the polarization state from one polarization state to another polarization state; and maintaining the switching current at a substantially same magnitude for each voltage pulse independently of a change in electrical response of the polarizable material caused by a change in the polarization state.

13. The method of claim 12, wherein maintaining the switching current at substantially same magnitude includes maintaining the magnitude within a 5% range of a predetermined magnitude.

14. The method of claim 12, wherein maintaining the switching current at substantially same magnitude includes disposing a source-to-drain current path of a transistor in series with the switching current path and biasing a gate terminal of the transistor with a biasing voltage to maintain a source-to-drain current, wherein the source-to-drain current is the switching current, at a predetermined magnitude.

15. The method of claim 14, including providing the biasing voltage to operate the transistor in a subthreshold regime.

16. The method of claim 12, wherein maintaining the switching current a substantially same magnitude includes disposing a resistor and a voltage source providing the voltage pulses in series with the switching current path to form a current source to provide a switching current at the substantially same magnitude.

17. The method of claim 12, wherein the number of discrete polarization states is at least 8.

18. The method of claim 12, wherein the number of programmable polarization states includes a non-reversed polarization state, where the entirety of the available polarization has the non-reversed polarization, a reversed polarization state, where the entirety of the available polarization has the reversed polarization, and a number of intermediate polarization states between the non-reversed and reversed polarization states, wherein each intermediate polarization state from non-reversed polarization state to the reversed polarization state has an increasing amount of reversed polarization.

19. The method of claim 18, wherein each polarization state is separated from immediately adjacent polarization states by a substantially same polarization amount, wherein each voltage pulse delivers a substantially same magnitude of switching charge, and wherein the polarization amount is linearly proportional to the magnitude of the switching charge delivered by a single voltage pulse such that the number of polarization states are linearly programmable.

20. The method of claim 19, wherein the magnitude of the switching charge is adjustable by adjusting a magnitude of the switching current and/or by adjusting a duration of the voltage pulses.

21. The method of claim 19, wherein the polarization amount is the magnitude of the switching charge delivered by a single voltage pulse so that the number of programmable polarization states in addition to the non-reversed polarization state is equal to the amount of available polarization divided by the magnitude of the switching of a single pulse.

22. The method of claim 19, wherein the polarization amount is a sum of the magnitude of switching charges provided by multiple pulses.

* * * * *